United States Patent [19]
Boerstler

[11] Patent Number: 5,903,012
[45] Date of Patent: May 11, 1999

[54] PROCESS VARIATION MONITOR FOR INTEGRATED CIRCUITS

[75] Inventor: David William Boerstler, Round Rock, Tex.

[73] Assignee: International Business Machines Corporation, Armonk, N.Y.

[21] Appl. No.: 08/901,297

[22] Filed: Jul. 28, 1997

[51] Int. Cl.[6] .................................................. H01L 23/58
[52] U.S. Cl. .............................................. 257/48; 438/18
[58] Field of Search ................................. 257/48; 438/18

[56] References Cited

U.S. PATENT DOCUMENTS 5,286,656  2/1994  Keown et al. ................................. 437/7
5,703,381  12/1997  Iwasa et al. ................................. 257/48

Primary Examiner—Olik Chaudhuri
Assistant Examiner—Douglas A. Wille
Attorney, Agent, or Firm—Casimer K. Salys; Alan L. Carlson; Andrew J. Dillon

[57] ABSTRACT

A process variation monitor sensing transistor parameters and supplying a compensation signal. The process variation monitor, monitors fabrication variations by utilizing a first and second transistor. The first transistor can be an un-implanted or a partially implanted transistor. The second transistor can be a conventional, fully implanted transistor or a partially implanted transistor. The second transistor having parameters which reflect process variations. The second transistor has a predetermined length, width, and implanting relationship to the first transistor. The transistors are biased which creates a signal in the first transistor that varies proportional to the parameters of the second transistor. Process induced parameters such as threshold voltage, effective length, transconductance, and mobility of the second transistor can be monitored by the first transistor, such that the signal produced by the first transistor can be used to compensate sensitive circuits for process variations.

24 Claims, 5 Drawing Sheets

PROCESS VARIATION MONITOR FOR INTEGRATED CIRCUITS

CROSS REFERENCE TO RELATED APPLICATION

The present application is related to copending U.S. application Ser. No. 08/901,298, entitled: CMOS Process Compensation Circuit" filed of an even date herewith and assigned to the assignee hereon named. The content of the copending application is hereby incorporated herein by reference thereto.

BACKGROUND OF THE INVENTION

1. Technical Field

The present invention relates in general to integrated circuits and in particular to a monitor for process variations. Still more particularly, the present invention relates to a fabrication variation monitor which can monitor transistor parameters and provide a compensation signal to circuits affected by process variations.

2. Description of the Related Art

The primary challenge in designing integrated circuits is to control circuit parameters, such as delay, in view of variations in the semiconductor fabrication process, supply voltage, and temperature. All of the above parameters and variables generally exhibit complex relationships among each other. Attaining homogeneous transistor operating parameters, such as threshold voltage and transconductance, within an integrated circuit is one of the most important, yet most difficult objectives for precision analog circuits. Transistor threshold voltage is also very critical in propagation speed for high speed low voltage digital circuits.

A metallic oxide semiconductor field effect transistor (MOSFET) has two regions in a silicon substrate, namely a source and drain region, which are disposed at a certain distance from each other. A MOS transistor also has an insulated gate electrode which is disposed above the silicon substrate, created by an insulating film such as a metal oxide film. A current flow from the drain to the source of a MOS transistor is controlled by a voltage supplied to the insulated gate electrode.

The voltage at the gate of a transistor which determines the boundary between the OFF state and the ON state in the drain current, is called the threshold voltage ($V_{TH}$). The threshold voltage of a MOS transistor is sensitive to fabrication parameters. The threshold voltage varies according to the thickness and nature of the insulating film utilized at the gate.

The length and width of the source, drain and gate regions determine many of the operating parameters of a MOS transistor. Currently, MOS transistors have dimensions which measure less than a micron. During the fabrication of a MOS transistor, doped layers are deposited or etched on the substrate where the source and drain exist. Etching and implanting are performed utilizing a "mask" which dictates the location at which the deposition or removal of material takes place on a silicon wafer.

During the implanting process, diffraction may occur around the edge of the aperture in the mask. Diffraction causes undercutting of the mask. In the implanting of a gate, undercutting will increase the desired dimension of the gate and decrease the adjacent region. Random fluctuations of the gate dimensions commonly occur in different geographic regions of semi-conductor chips. Underexposure can lead to smaller than desired lengths. Ion implanting and ion "drive-in" are the principle cause of smaller than expected gate lengths. At the edge of the wafer, process tolerances are more difficult to control than at the center. Also, heating in the fabrication process causes migration of atoms at the boundary of the implantation or etch into adjacent regions. Heating also alters the desired dimensions. Further, in the etching process, acid can spread under a mask aperture edge and remove material. It is well known in the art that many fabrication process steps can change the desired dimensions of semiconductor regions. Hence, the desired length (L) and width (W) of the source, drain, and gate can be described as the actual or effective length ($L_{eff}$) and the effective width ($W_{eff}$). It is important to note that depending on whether the mask is a negative for etching or a positive for deposition, $L_{eff}$ can be increased or decreased. Underexposure can increase and decrease $L_{eff}$. Likewise, overexposure can increase and decrease $L_{eff}$.

Other process variation leading to diverse MOSFET parameters are doping concentration and mobility. Semiconductor process variations particularly $L_{eff}$ and $W_{eff}$ greatly effect the threshold voltages of MOS transistors. In many circuits, a slight shift or deviation in critical threshold voltages produces unacceptable signal processing results.

Techniques for stabilization of transistor threshold voltages have received a substantial amount of attention in the area of precision circuits. Examples of precision circuits, or circuits which are very sensitive to process variations include voltage controlled oscillators and off-chip drivers.

Known compensation techniques for circuits requiring accurate threshold voltages are extensive and diverse. Threshold voltage compensation techniques are typically external. It is very common in the prior art to compensate for threshold voltage variations utilizing indirect methods. Indirect methods do not specifically sense the threshold voltage, or utilize detection of the source of the problem, but compensate by sensing the adverse effects which the threshold voltage variation has created. Generally, each threshold voltage compensation technique implemented is driven by the application of the circuit.

Process variations can also cause propagation aberrations in high speed low voltage digital circuits, particularly in off-chip drivers. Process variations can cause propagation times which range from one half to one and one half of the design target value. Signals arriving too early and signals arriving too late can cause execution difficulties. Timing issues due to process variations are prevalent in on-chip as well as chip-to-chip designs. To control the propagation of high speed low voltage digital circuits, it is necessary to reduce the sensitivity of the circuits to process variations. Propagation compensation circuits have only a limited ability to increased propagation speed.

Similarly, timing problems associated with process variations and threshold voltage are encountered in analog circuits. Control circuits, such as oscillator circuits are particularly sensitive to process variations. A common technique employed in most analog systems today is to take advantage of good matching between two identical transistors. The two transistors are placed proximate to each other on a substrate and identically biased. This method is very common in current mirrors. However, when operating parameters for a large number of transistors are critical, it becomes impossible to take advantage of matching by proximity.

Current calibration techniques are presently used to compensate control circuits. Some current calibration techniques require bias transistors which are calibrated against a fixed reference then utilized to bias an analog cell. The disadvantage of such schemes is that frequent calibration is necessary. Most current calibration designs can not be calibrated during operation and require "off-line" calibration. Techniques to solve the latter problem have been developed by utilizing additional calibration cells. However, the need to switch the bias currents and supply control signals to multiple circuits adds complexity and requires chip area. Current calibration techniques can effectively compensate for threshold voltage, but this technique is unduly complex.

Other known compensation systems use a digital memory and a digital to analog converter to generate reference current for compensation. The reference currents are utilized to stabilize threshold voltages. Cross coupling techniques are also popular for minimizing the input offsets due to threshold voltage variations in analog circuits such as high gain operational amplifiers. Compensation circuits may also utilize comparators to improve matching of threshold voltages.

Tighter process tolerances can be adopted to improve performance or reduce variability, but this substantially increases the cost of the product. Another commonly used technique is extensive testing and selection to isolate acceptable devices. This also increases the cost of the product due to additional testing effort and the corresponding lower yield. A typical threshold voltage compensation circuit compensates for variations utilizing resistive elements and comparators. Known compensation circuits are either based upon devices which are correlated and unable to respond to absolute process variations or they are based upon external references or phenomena. Known compensation circuits adjust for threshold voltage variations by compensating circuit response. Hence, present threshold voltage compensation techniques are deficient because they do not monitor actual device parameters.

To compensate for process induced device variations, complex arrangements have hitherto been required. Hence, a need exists for a simple effective and efficient process variation detector or monitor to compensate for fabrication variations.

SUMMARY OF THE INVENTION

It is therefore one object of the present invention to provide an on chip monitor for process variations.

It is another object of the present invention to provide a transistor parameter monitor which can be utilized to compensate for process variations.

It is yet another object of the present invention to provide a transistor parameter monitor which can monitor and compensate circuits for the effects of fabrication variations.

The foregoing objects are achieved as is now described. A process variation monitor sensing transistor parameters and supplying a compensation signal. The process variation monitor monitors fabrication variations by utilizing a first and second transistor. The first transistor can be an un-implanted or a partially implanted transistor. The second transistor can be a conventional, fully implanted transistor or a partially implanted transistor. The second transistor having parameters which reflect process variations. The second transistor has a predetermined length, width, and implanting relationship to the first transistor. The transistors are biased which creates a signal in the first transistor that varies proportional to the parameters of the second transistor. Process induced parameters such as threshold voltage, effective length, transconductance, and mobility of the second transistor can be monitored by the first transistor, such that the signal produced by the first transistor can be used to compensate sensitive circuits for process variations. The above as well as additional objects, features, and advantages of the present invention will become apparent in the following detailed written description.

BRIEF DESCRIPTION OF THE DRAWINGS

The novel features believed characteristic of the invention are set forth in the appended claims. The invention itself, however, as well as a preferred mode of use, further objects and advantages thereof, will best be understood by reference to the following detailed description of an illustrative embodiment when read in conjunction with the accompanying drawings, wherein:

DETAILED DESCRIPTION OF PREFERRED EMBODIMENT

Figure 1:
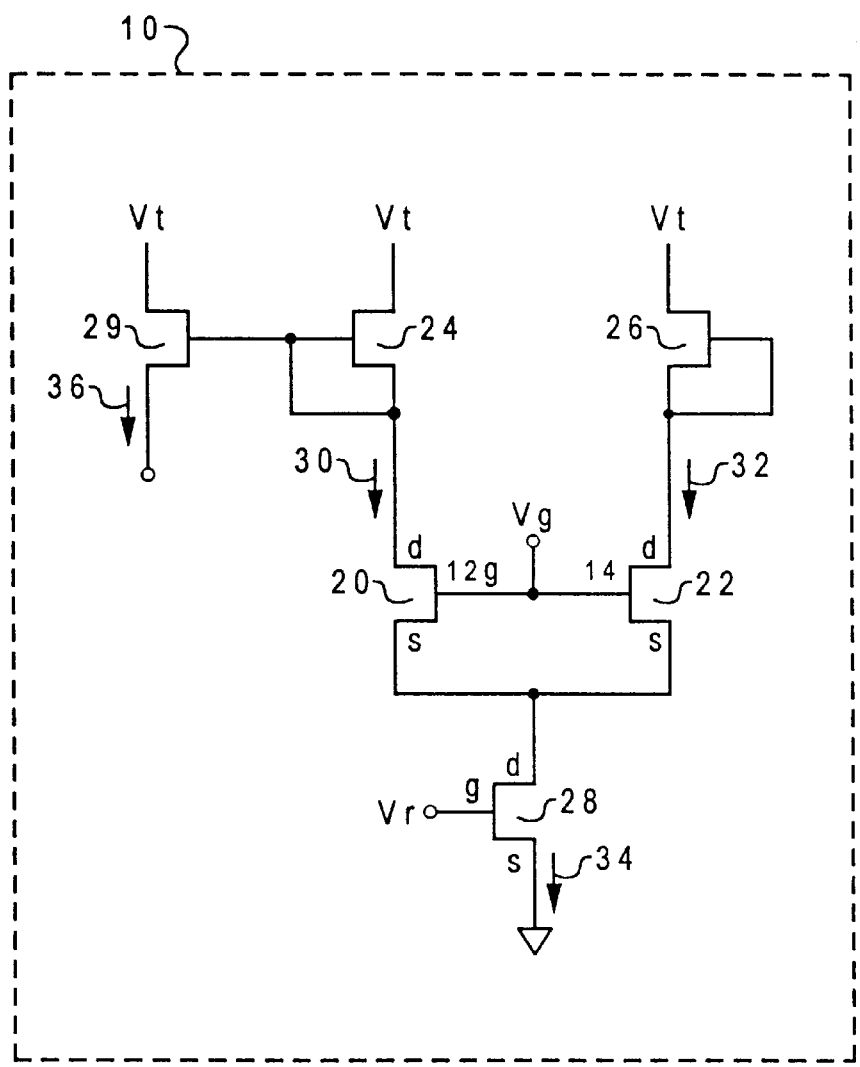
FIG. 1 depicts a fabrication process variation monitor in accordance with the present invention.

With reference now to the figures and in particular with reference to FIG. 1, a fabrication process variation monitor 10 is depicted. A preferred embodiment of the fabrication process variation monitor 10 is utilized in an integrated circuit to monitor the threshold voltage ($V_{th}$) of a transistor. However, other parameters can also be effectively monitored by fabrication process variation monitor 10.

Figure 2A:
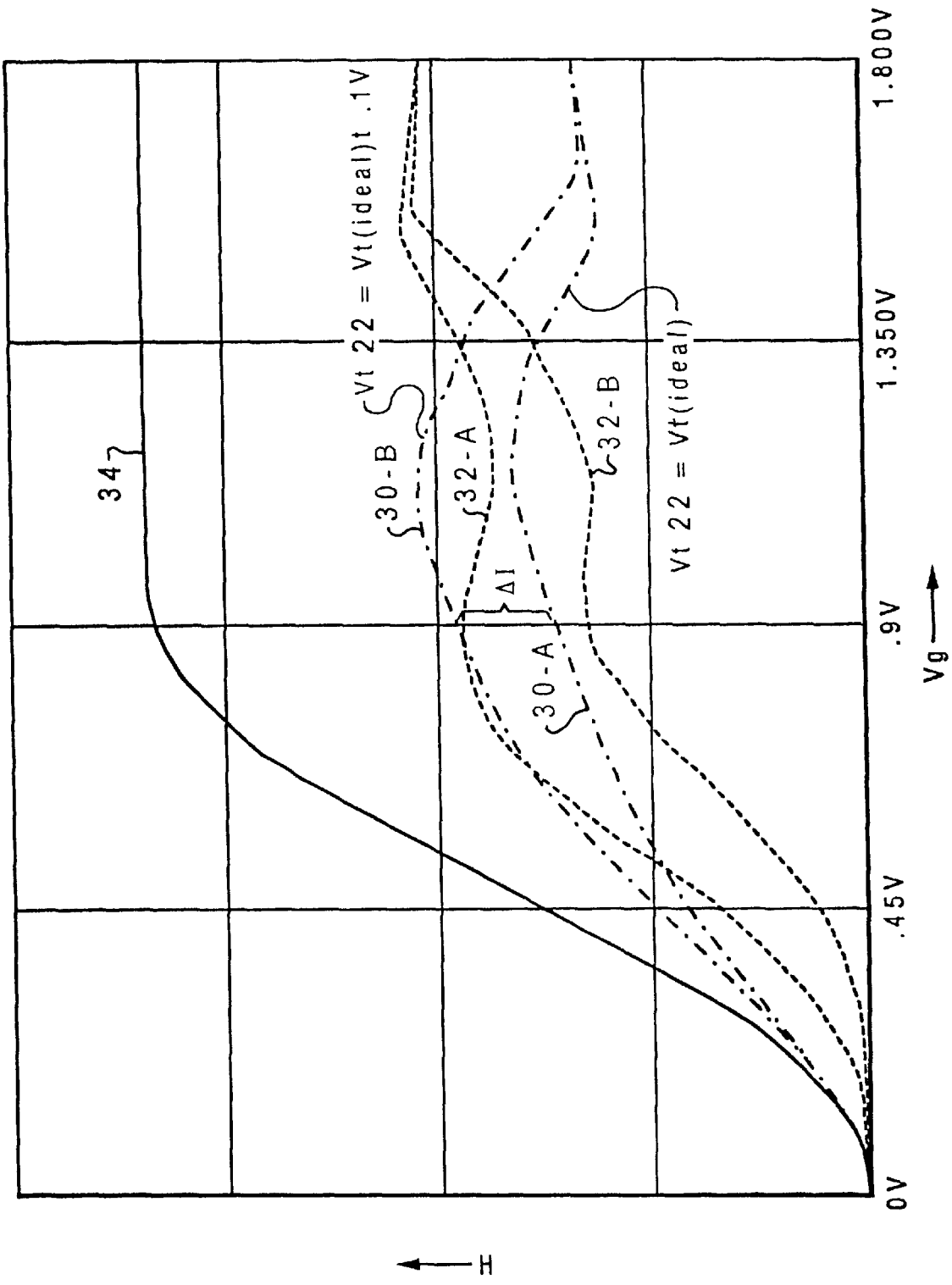
FIG. 2A illustrates a graph of the monitor transistor current as a function of gate voltage and its relationship to threshold voltage, in accordance with the present invention.

In a preferred embodiment, transistor 20 provides a current 30 which is a function of characteristics of transistor 22. Transistor 28 sinks a predetermined amount of current 34. The amount of current provided to transistor 28 by each of transistor 20 and 22 is a function of voltage ($V_g$) which is applied to the gates 12 and 14 of transistors 20 and 22. Referring briefly to FIG. 2A, current 30, current 32, and their relationship to $V_g$ and the threshold voltage ($V_{th}$) of transistor 22 is depicted.

Referring again to FIG. 1, in a preferred embodiment, transistor 22 is a conventional N-FET and transistor 20 is a N-FET which does not have a p-well implant and is an un-implanted transistor. Hence, in this embodiment, transistor 20 has a threshold voltage of zero volts. When transistor 20 is un-implanted, zero volts are required across the gate and source of transistor 20 in order for transistor 20 to conduct current. The p-well implant of transistor 22 shifts the threshold voltage of transistor 22 from zero volts to a value above the threshold voltage of transistor 20. With all other variables and parameters static, the amount of implanting dictates the threshold voltages of a transistors 20 and 22.

In an alternate embodiment, transistor 20 and transistor 22 are partially implanted transistors. A typical low voltage integrated circuit possesses conventionally implanted transistors having threshold voltages which range between 0.4 volts and 0.5 volts (the range is due to process variations and other variables). Partially implanted transistors 20 and 22 will have a threshold voltage between zero volts and the threshold voltage of conventionally implanted transistors on the same chip. Partially implanting transistor 20 for a desired threshold voltage of 0.2 volts and partially implanting transistor 22 for a desired threshold voltage of 0.3 volts allows fabrication process variation monitor 10 to focus on a particular operating point. This operating point is possibly more susceptible to a process variation or manifests critical deviations from the desired values.

Another embodiment, fabricates transistor 20 as an un-implanted transistor and transistor 22 as a partially implanted transistor. This embodiment can also focus on a different process variable or a different operating range. For optimum monitoring, the implanting relationship between transistor 20 and transistor 22 must be controlled and the dimensional relationship must be known. Additionally, transistor 20 may be partially implanted and transistor 22 a conventional FET. Again, the width, length, and implantation are related and critical to the effective monitoring of a particular parameter in a particular operating region.

Referring again to FIG. 2A, a graph of potential variations of current 30 are depicted as 30-A and 30-B. Currents 30A, 30B, 32A and 32B are depicted as a function of $V_g$. An increase in the threshold voltage of transistor 22 shifts current 32 in relationship to current 30. As depicted in FIG. 2A, as $V_g$ increases, currents 30 and 32, both begin to increase. The slopes of currents 30 and 32 are a function of their respective width to length ratios. In a preferred embodiment, the fabrication process monitor 10 is operated in the region of the FIG. 2A graph where current 34 reaches a steady state. With ideal fabrication, current 32 is approximately equal to current 30 for a predetermined $V_g$. The graph depicted in FIG. 2A, illustrates current 30 and current 32 for an ideal fabrication process (depicted as 30-A and 32-A) where $VT_{22}=V_{Tideal}$. Currents 30-B and 32-B depicts a fabrication process which has induced a threshold offset in transistor 22 of +100 mv, where $V_{T22}=V_{Tideal}+0.1V$. As illustrated, for a fixed value of $V_g$, such as $V_g=0.9V$, a large difference in current (depicted as ΔI or 30-B —30-A is realized due to the fabrication process variations by fabrication process variation monitor 10.

The output of fabrication process variation monitor 10 is very adaptable. The signal or current produced by fabrication process variation monitor 10 can be adapted to a desired application by selecting an operating point which accentuates variable such as the amount of implanting. Signal intensity or slope may be controlled by fabrication parameters and bias voltages. Additional scaling or amplification can also be utilized to shape the basic response of the fabrication process variation monitor 10 output.

An additional embodiment, constructing fabrication process variation monitor 10 such that the threshold voltage of transistor 20 is below the threshold voltage of transistor 22 would provide alternative output functions.

In a preferred embodiment, transistor 28 is a conventional FET operating as a current source. The gate of transistor 28 is connected to reference voltage ($V_r$). The drain of transistor 28 is connected to the sources of transistors 20 and 22. Transistor 28 provides a bias for the combined current of transistor 20 and transistor 22. The sum of current 30 and current 32 is equal to current 34, and the magnitude of each current is dependent on $V_g$. applied to gates 12 and 14.

Increasing the reference voltage $V_r$ on the gate of transistor 28 increases current 34 and decreasing the reference voltage decreases current 34. Reducing current 34 decreases the slope of the currents 30 and 32 on FIG. 2A. Transistor 28 biases transistors 20 and 22 such that the sum of the currents through transistors 20 and 22 is equal to the current sunk by transistor 28.

Fabrication process variation monitor 10 is physically implemented by each transistor having a width and a length on a silicon substrate. The width and length of the transistors will hereafter be designated as $W_{tx\#}$ and $L_{tx\#}$ where tx# is the transistor number. Referring to FIG. 1, in a preferred embodiment, the design of the width and the length of transistors 20 and 22 is such that when ideal fabrication occurs, given $V_g$ equal the desired threshold voltage of transistor 22, current 30 and current 32 are identical. In reality fabrication process variations shift the ideal operating parameters of transistors, particularly those transistors which have an implant. Therefore, transistors such as transistor 22, having a p-well implant, manifest process variations in parameters such as threshold voltage, transconductance, mobility, and temperature sensitivity.

The length and width relationship of transistors 20 and 22 is critical because it creates a benchmark for the ideal fabrication process. In a preferred embodiment, if near perfect fabrication is attained, the anticipated threshold voltage will be realized and the applied gate voltage $V_g$ will produce equal currents in transistor 20 and transistor 22. As fabrication variations occur in transistor 22, current 30 either increases or decreases, responsive to the fabrication variations. The design objective for equal currents 30 and 32 allow maximum dynamic operating range of the fabrication variation monitor 10. In an alternate embodiment, each transistor could be given an independent threshold voltage by partially implanting each transistor 20 and 22.

The design goal producing a length to width relationship of transistors 20 and 22 such that transistors 20 and 22 produce identical currents (i.e., 30=32) is theoretically accomplished by making $L_{20}>L_{22}$ and $W_{20}<W_{22}$ such that $V_{t22}-V_{t20}=SQRT[2I1/B1-SQRT[2I2/B2]$ where $B1=k'W_{20}/L_{20}$ and $B2=k'W_{22}/L_{22}$ where k'is the process transconductance. Further $V_{t20}\sim 0$ and $I1\sim B1/2\times(V_{t22})^2$ such that $B2>>B1$. Where $V_{t22}-V_{t20}$ is derived from the basic equation for saturation of MOS transistor, $Vds>Vgs-Vt^2$ utilizing $I1=I2$.

For optimum monitoring performance $W_{20}$, $W_{22}$, $L_{20}$ and $L_{22}$ must be much larger than minimum dimensions. Minimum dimensions increase the sensitivity of fabrication process variation monitor 10 to lithography tolerances. Larger than minimum dimensions make current 36 a strong function of the threshold voltage of transistor 20.

If $L_{22}$ is too small current 36 increases as process induced $L_{eff}$ increases and current 36 decreases as process induced $L_{eff}$ decreases. If transistor 20 is a conventionally implanted N-FET, current 36 will be a strong function of $L_{eff}$ only. If $L_{eff}$ and $V_{th}$ are the same for transistors 20 and 22, currents 30 and 32 will be equally shared. $L_{eff}$ would dominate if transistors 20 and 22 were similar in operating parameters. An additional embodiment, geometrically rotates either transistor 20 or transistor 22 90 degrees with respect to the other. Since orthogonal lithography variations are independent, the fabrication process variation monitor 10 would then be responsive to $W_{eff}$. Further, fabrication variation monitor 10 could consist of two individual orthogonal structures in parallel to achieve the same $W_{22}/L_{22}$ ratio. Rotation may require weighting of the individual monitor currents. Width and length variations can be translated into X and Y axis variations. As a result of mask placement and a corresponding etch or implantation, variations can be classified as X or Y axis variations. Generally, all X variations are correlated to one another and all Y variations are correlated to one another. Therefore, weightings may be required for X variations or for Y variations depending on the reference point, the magnitude of deviation and the sensitivity to each variation.

Threshold voltage and $L_{eff}$ are independent. Current 36 may be used for many classes of compensation. A circuit such as a voltage controlled oscillator (VCO) may behave differently based upon whether the process variation is due to threshold voltage as opposed to changes in $L_{eff}$. By focusing on a direct monitoring of threshold voltage or a direct measurement of $L_{eff}$, the VCO can be compensated most effectively.

In a preferred embodiment, transistor 29 is a current mirror. Transistor 29 has its gate connected to the gate of transistor 24 such that current 30 is scaled and proportional to current 36. In a preferred embodiment, current 36 is proportional to the square of the threshold voltage of transistor 22. The relationship of the threshold voltage of a transistor 22 to current 36 can be used to compensate any circuit which is sensitive to threshold voltage, $L_{eff}$, or other parameters, due to any fabrication process offset which influences these parameters.

In a preferred embodiment, current 36 provides a current signal which corresponds to fabrication process variations. In an alternate embodiment a voltage signal could be produced by fabrication process variation monitor 10. Many methodologies, such as sensing current 36 with a resistive element, may be utilized to translate monitor current 36 into a voltage signal.

In a preferred embodiment, transistor 20 and transistor 22 are positioned adjacent to one another to monitor threshold voltage. In an alternate embodiment, transistor 22 could be placed remotely or where critical circuits may anticipate process variations.

Another embodiment place transistor 20 remotely from transistor 22. Then a compare function can detect process variations in certain areas and provide compensation responsive to the geographic or characteristic variations. In the embodiment, transistors 20 and 22 may be identical.

Figure 2B:
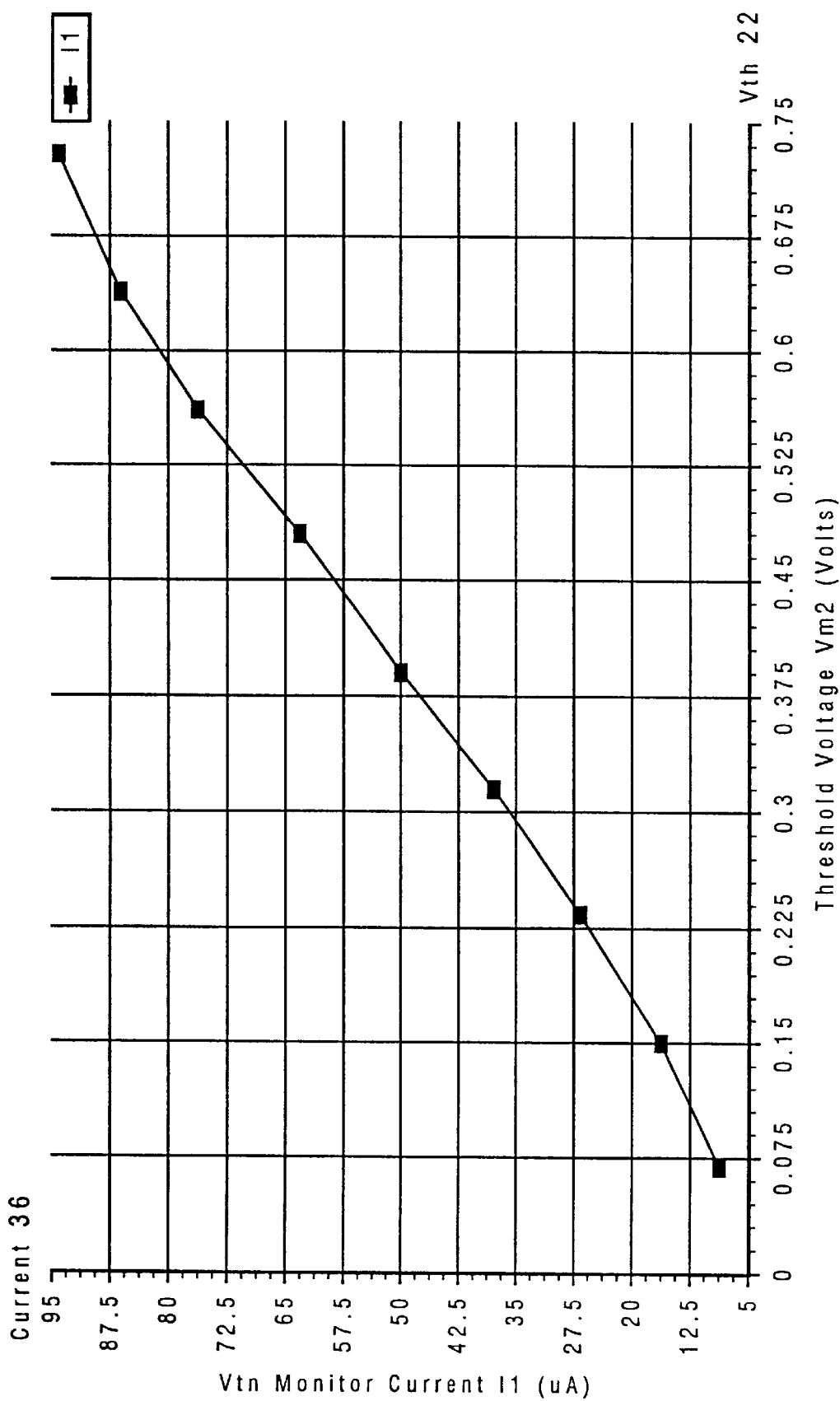
FIG. 2B illustrates a more detailed graph of monitor current as a function of threshold voltage in accordance with a preferred embodiment.

FIG. 2B depicts a detailed graph of a preferred embodiment which illustrates current 36 as a function of the threshold voltage of transistor 22. As the threshold voltage of transistor 22 is offset from the design value objective, due to the variations in the fabrication process, current 36 responds, having an approximately linear relationship, in the region shown, to the threshold voltage of transistor 22.

Figure 2C:
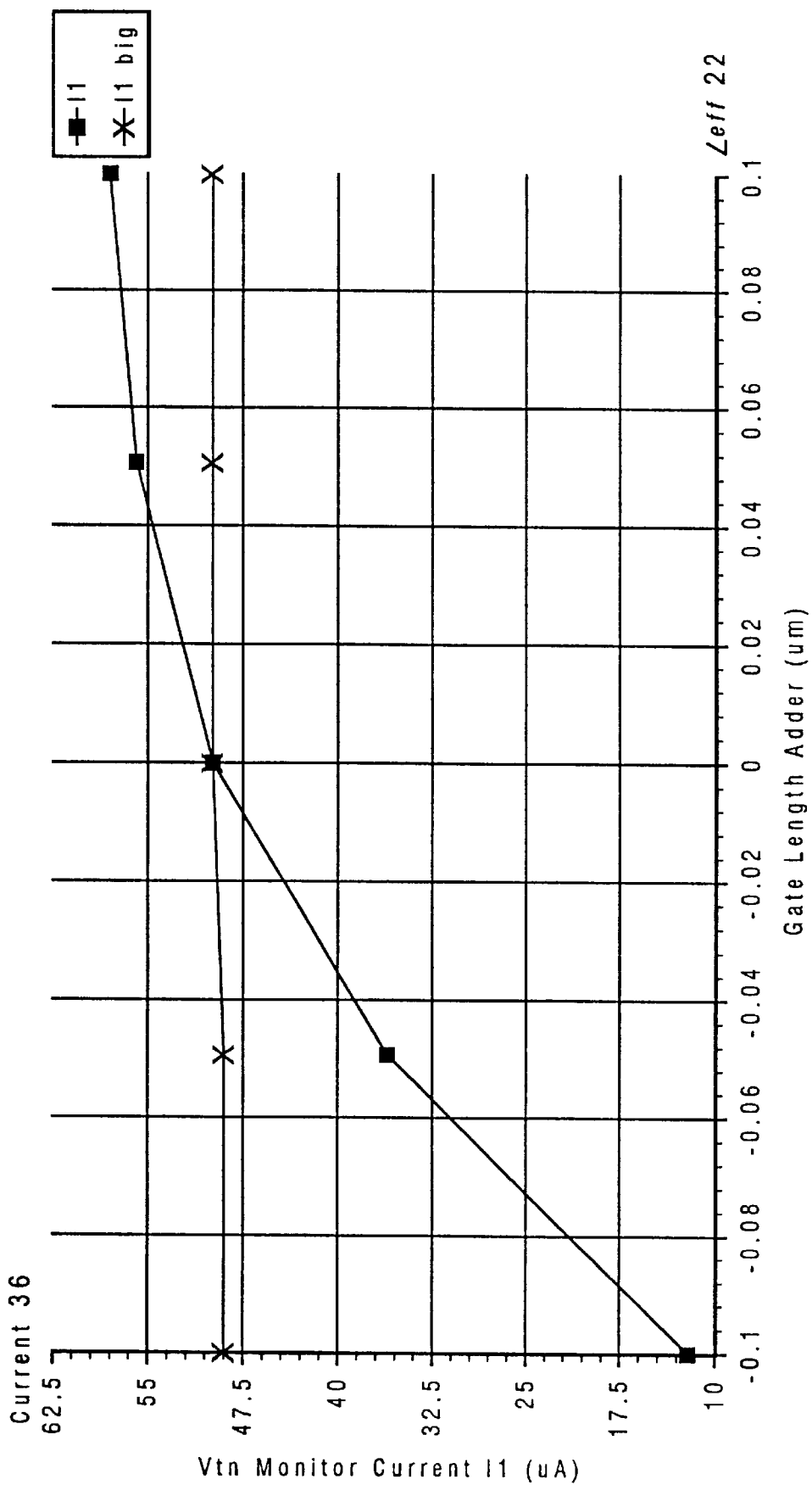
FIG. 2C illustrates a graph of monitor current as a function of the effective length of a transistor gate, a process variation, in accordance with a preferred embodiment.

FIG. 2C depicts a detailed graph of a preferred embodiment illustrating the relationship between current 30 and the gate length ($L_{eff}$) of transistor 22. The center of the $L_{eff}$ axis denotes the intended length and to the left of center denotes a $L_{eff}$ which is smaller than the desired length. Likewise, to the right of center denotes a $L_{eff}$ which is larger than the desired length. The horizontal line which intersects current 36 at $L_{eff}$= zero depicts a monitor current for large $L_{eff}$ of transistor 22 as a function of the process induced change in length.

As the actual length or effective length of the gate of transistor 22 deviates from zero, producing an effective length, current 30 through transistor 20 fluctuates. More particularly, if the fabrication process has produced a gate 0.1 microns smaller than the desired dimension the monitor current reduces to near 10 micro-amps. Whereas, if the gate length is 0.1 microns larger than desired, the monitor current increases to about 60 micro-amps. In a preferred embodiment, more dynamic range is allowed for reduced $L_{eff}$ because of the application. However, in alternate embodiments the operating point could be shifted if the application warrants.

Figure 3:
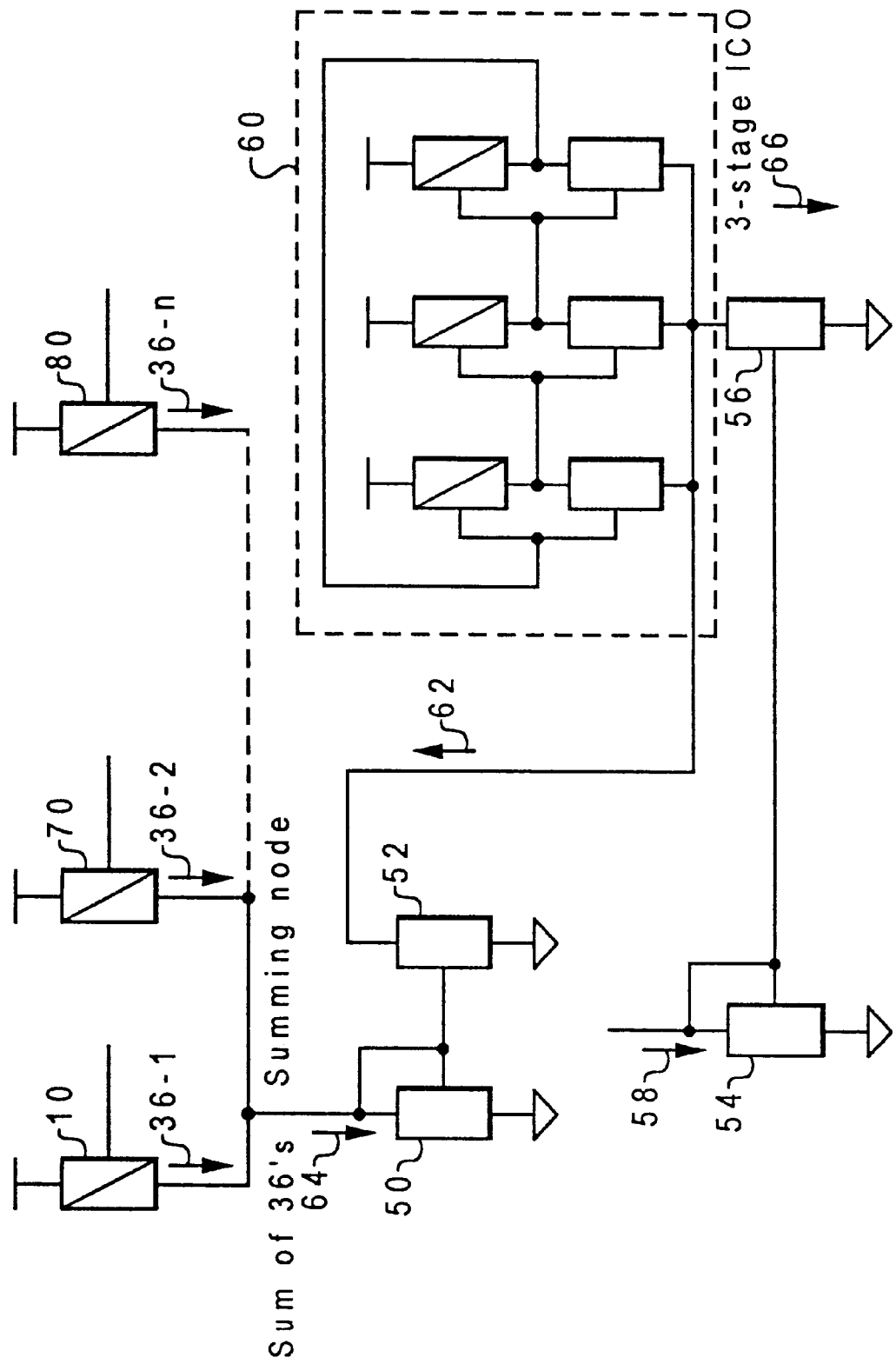
FIG. 3 depicts an application which can effectively utilize the fabrication process variation monitor, a current controlled oscillator, in accordance with the present invention.

FIG. 3 depicts an application which can effectively use fabrication process variation monitor 10. In a preferred embodiment, a plurality of fabrication variation monitors designated 10, 70 and 80, each supply a portion of current 64 to load 50. Current 64 is mirrored by current 62 of current mirror 52. Current 62 alters the bias of the current controlled oscillator 60. Each monitor can provide compensation for individual variations as a result of the fabrication process. However, a single fabrication variation monitor may be used to provide compensation to current controlled oscillator 60. In a prefereded embodiment, current controlled oscillator 60 is realized by three stages. Current controlled oscillator 60 is biased by current source 56. Current source 56 mirrors reference device 54 which conducts a reference current 58. In a preferred embodiment, reference current 58 is an order of magnitude larger than the total of the compensation currents 64 which are summed into current load 50.

In summary, compensation currents which are related to threshold voltage offsets and other fabrication dependent parameters are supplied to load 50. The current through load 50 is mirrored by current mirror 52. Current controlled oscillator 60 is biased by current source 56 which mirrors reference device 54. Current mirror 52 can complement or deduct from bias current 66 of current controlled oscillator 60. Compensation current 62 changes the bias point of the current controlled oscillator 60 and compensates for fabrication process variations. For a more in depth description of CMOS process compensation circuit refer to the cross referenced copending U.S. application entitled "CMOS Process Compensation Circuit" filed of an even date herewith. The content of the copending application is hereby incorporated by reference.

While the invention has been particularly shown and described with reference to a preferred embodiment, it will be understood by those skilled in the art that various changes in form and detail may be made therein without departing from the spirit and scope of the invention.

What is claimed is:

1. A monitor for signaling fabrication process variations which manifest in an integrated circuit, said monitor comprising:

a first transistor within an integrated circuit constructed utilizing an incomplete fabrication process;

a second transistor within an integrated circuit constructed utilizing a different fabrication process than said incomplete fabrication process of said first transistor, said second transistor having a known fabrication relationship with said first transistor; and at least one bias circuit within said integrated circuit for biasing said first and said second transistors, such that said first transistor produces a signal which varies in proportion to fabrication process variations between said incomplete fabrication process utilized to construct said first transistor and said different fabrication process utilized to construct said second transistor, wherein said signal can be used to compensate sensitive circuits for fabrication process variations.

2. The monitor according to claim 1, wherein said known fabrication relationship is a geometrical relationship.

3. The monitor according to claim 1, wherein said known fabrication relationship is an implanting relationship.

4. The monitor according to claim 1, wherein said first transistor and said second transistor are field effect transistors.

5. The monitor according to claim 1, wherein said first transistor is an un-implanted transistor and said second is a conventional transistor.

6. The monitor according to claim 1, wherein said first transistor is a partially implanted transistor and said second transistor is a conventional transistor.

7. The monitor according to claim 1, wherein said first transistor is an un-implanted transistor and said second transistor is a partially implanted transistor.

8. The monitor according to claim 1, wherein said first transistor is a partially implanted transistor and said second transistor is a partially implanted transistor.

9. The monitor according to claim 1, wherein said signal is proportional to a threshold voltage of said second transistor.

10. The monitor according to claim 1, wherein said signal is proportional to an effective length of said second transistor.

11. The monitor according to claim 1, wherein said signal is proportional to an effective width of said second transistor.

12. The monitor according to claim 1, wherein said signal is a current.

13. A transistor parameter monitor comprising:
    a first transistor having a predetermined geometry and implanting;
    a second transistor having a parameter, said second transistor having a predetermined geometry and implanting relationship with said first transistor; and
    a bias circuit coupled to said first and second transistor such that said first transistor produces a signal which varies proportional to said parameter of said second transistor, wherein said signal can be utilized to compensate for varying transistor parameters.

14. The transistor parameter monitor according to claim 13, wherein said first transistor is a un-implanted transistor and said second transistor is a conventional transistor.

15. The transistor parameter monitor according to claim 13, wherein said first transistor is a partially implanted transistor and said second transistor is a conventional transistor.

16. The transistor parameter monitor according to claim 13, wherein said first transistor is an un-implanted transistor and said second transistor is a partially implanted transistor.

17. The transistor parameter monitor according to claim 13, wherein said first transistor is a partially implanted transistor and said second transistor is a partially implanted transistor.

18. The transistor parameter monitor according to claim 13, wherein said signal is a current.

19. The transistor parameter monitor according to claim 13, wherein said signal is scaled.

20. The transistor parameter monitor according to claim 18, wherein said signal is scaled by a current mirror.

21. A circuit for providing a signal which is proportional to a transistor parameter comprising:
    a first transistor; and
    a second transistor having a predetermined size relationship and a predetermined fabrication process relationship with said first transistor, wherein said second transistor has a substantially identical bias condition as said first transistor, such that a current is conducted by said first transistor which is proportional to a parameter of said second transistor and said current can be utilized to compensate for aberration caused by variations in transistor parameters.

22. The circuit according to claim 21, wherein said current conducted by said first transistor is proportional to an effective length of said second transistor.

23. The circuit according to claim 21, wherein said current conducted by said first transistor is proportional to an effective width of said second transistor.

24. The circuit according to claim 21, wherein said current conducted by said first transistor is proportional to a threshold voltage of said second transistor.

* * * * *